US009122172B2

(12) United States Patent
Tamura

(10) Patent No.: US 9,122,172 B2
(45) Date of Patent: *Sep. 1, 2015

(54) REFLECTION SHADOW MASK ALIGNMENT USING CODED APERTURES

(71) Applicant: Advantech Global, LTD, Tortola (VG)

(72) Inventor: Nobuhiko Tamura, Murrysville, PA (US)

(73) Assignee: Advantech Global, LTD, Tortola (VG)

( * ) Notice: Subject to any disclaimer, the term of this patent is extended or adjusted under 35 U.S.C. 154(b) by 0 days.

This patent is subject to a terminal disclaimer.

(21) Appl. No.: 13/973,328

(22) Filed: Aug. 22, 2013

(65) Prior Publication Data

US 2013/0342843 A1 Dec. 26, 2013

Related U.S. Application Data

(63) Continuation-in-part of application No. 13/695,488, filed as application No. PCT/US2011/037501 on May 23, 2011.

(60) Provisional application No. 61/351,470, filed on Jun. 4, 2010.

(51) Int. Cl.
*G01B 11/00* (2006.01)
*G03F 9/00* (2006.01)
*C23C 14/04* (2006.01)
*C23C 16/04* (2006.01)

(52) U.S. Cl.
CPC ............ *G03F 9/7049* (2013.01); *C23C 14/042* (2013.01); *C23C 16/042* (2013.01)

(58) Field of Classification Search
CPC ....... G03F 9/7049; G03F 9/7088; G03F 9/00; G01B 11/272; H01L 21/681
USPC .................................................. 356/399–401
See application file for complete search history.

(56) References Cited

U.S. PATENT DOCUMENTS

| 3,504,606 | A | * | 4/1970 | Macovski ..................... 396/307 |
| 3,647,948 | A | * | 3/1972 | Eto et al. ........................ 386/313 |
| 3,885,877 | A | * | 5/1975 | Horwath et al. .............. 356/400 |
| 4,109,158 | A | * | 8/1978 | Blitchington et al. ........ 250/548 |
| 4,211,489 | A | | 7/1980 | Kleinknecht et al. |

(Continued)

FOREIGN PATENT DOCUMENTS

| CN | 101158818 A | 4/2008 |
| KR | 100296634 B1 | 8/2001 |

(Continued)

*Primary Examiner* — Tarifur Chowdhury
*Assistant Examiner* — Isiaka Akanbi
(74) *Attorney, Agent, or Firm* — The Webb Law Firm

(57) ABSTRACT

In a shadow mask-substrate alignment method, a light source, a beam splitter, a first substrate including a first grate, a second substrate including a second grate, and a light receiver are positioned relative to each other to define a light path that includes light output by the light source being reflected a first time by the beam splitter. The light reflected the first time passes through the first or second grate and is at least partially reflected a second time by the second or first grate back through the first or the second grate, respectively. The light reflected the second time passes at least partially through the beam splitter for receipt by the light receiver. The orientation of the first substrate, the second substrate or both is adjusted to position the first grate, the second grate, or both until a predetermined amount is received by the light receiver.

19 Claims, 8 Drawing Sheets

(56) References Cited

U.S. PATENT DOCUMENTS

| | | | |
|---|---|---|---|
| 4,590,527 A * | 5/1986 | Warner | 360/78.11 |
| 4,828,392 A | 5/1989 | Nomura et al. | |
| 4,926,545 A | 5/1990 | Pimpinella et al. | |
| 5,119,355 A | 6/1992 | Yamamoto et al. | |
| 5,361,132 A | 11/1994 | Farn | |
| 5,414,514 A | 5/1995 | Smith et al. | |
| 5,528,027 A | 6/1996 | Mizutani | |
| 5,563,682 A * | 10/1996 | Aikawa et al. | 355/53 |
| 6,661,951 B1 | 12/2003 | Blair et al. | |
| 7,902,494 B2 | 3/2011 | Klaver et al. | |
| 2002/0080365 A1 | 6/2002 | Monshouwer et al. | |
| 2006/0007442 A1 | 1/2006 | Heerens et al. | |
| 2006/0086321 A1 | 4/2006 | Brody et al. | |
| 2007/0019173 A1 | 1/2007 | Marz | |
| 2010/0065726 A1 | 3/2010 | Zhong et al. | |
| 2010/0316941 A1 | 12/2010 | Sasaki | |

FOREIGN PATENT DOCUMENTS

| | | |
|---|---|---|
| WO | 9934258 A1 | 7/1999 |
| WO | 2011153016 A1 | 12/2011 |

\* cited by examiner

US 9,122,172 B2

REFLECTION SHADOW MASK ALIGNMENT USING CODED APERTURES

CROSS REFERENCE TO RELATED APPLICATIONS

This application is a continuation-in-part of U.S. application Ser. No. 13/695,488, filed Oct. 31, 2012, which is the United States national phase of International Application No. PCT/US2011/037501, filed May 23, 2011, which claims the benefit of U.S. Provisional Application No. 61/351,470, filed Jun. 4, 2010. The disclosure of each of these documents is hereby incorporated in its entirety by reference.

BACKGROUND OF THE INVENTION

1. Field of the Invention

The present invention relates to accurately aligning a shadow mask and a substrate in connection with the deposition of a material on the substrate in a vapor deposition system.

2. Description of Related Art

Accurate aligning of a shadow mask to a substrate in a vapor deposition system is critical to the accurate deposition of one or more materials on the substrate. Unfortunately, most vapor deposition systems include enclosed vacuum deposition vessels where one or more vapor deposition events occur and it is difficult to manually align a shadow mask to a substrate with a high degree of accuracy. Moreover, current automated and semi-automated systems for aligning a shadow mask to a substrate do not have the necessary alignment accuracy to provide a desired degree of accuracy when vapor depositing materials on the substrate, especially when the substrate is subject to multiple vapor deposition events using multiple different shadow masks It would, therefore, be desirable to provide a method and system of shadow mask to substrate alignment that enables one or more materials to be vapor deposited on the substrate via one or more shadow masks in a highly accurate and repeatable manner

SUMMARY OF THE INVENTION

Disclosed herein is a shadow mask-substrate alignment method comprising: (a) positioning a collimated light source, a beam splitter, a substrate including a first grate, a shadow mask including a second grate, and a light receiver relative to each other to define a light path that includes collimated light output by the collimated light source being at least partially reflected by the beam splitter, the at least partially reflected collimated light passing through one of the first or second grate and being at least partially reflected by the other of the first or second grate back through the one of the first or second grate, and the at least partially reflected light reflected back through the one of the first or second grate passing at least partially through the beam splitter for receipt by the light receiver; and (b) causing the orientation of the substrate, the shadow mask or both to be adjusted to position the first grate, the second grate, or both the first and second grates until a predetermined amount is received by the light receiver.

Each grate can include a plurality of spaced bars. A gap can separate each pair of spaced bars. Each bar and each gap can have the same width.

Each grate can include a plurality of spaced bars and a gap separating each pair of spaced bars. Step (b) can include causing the orientation of the substrate, the shadow mask or both to be adjusted to position elongated axes of the bars of the first grate parallel to elongated axes of the bars of the second grate and to position the bars of the first grate and the second grate to partially overlap the gaps of the second grate and the first grate, respectively.

The bars of the first and second grates can partially overlap the gaps of the second and first grates, respectively, by 50%.

The collimated light source can comprise an LED and a collimating lens operative for collimating light output by the LED.

The light receiver can comprise a PIN diode and a focusing lens operative for focusing light received from the beam splitter onto the PIN diode.

A longitudinal axis of each bar can extend radially ±15 degrees from a central axis of the corresponding substrate or shadow mask.

Also disclosed herein is a shadow mask-substrate alignment method comprising: (a) providing a first substrate having a plurality of first grates in a pattern, wherein each first grate includes a plurality of spaced bars and a gap between each pair of spaced bars; (b) providing a second substrate having plural sets of spaced reflective surfaces in the same pattern as the plurality of first grates, wherein each set of spaced reflective surfaces includes a pair of spaced reflective surfaces; (c) defining a plurality of light paths, wherein each light path includes a light source and a light receiver at opposite ends of the light path, and a beam splitter in the light path between the light source and the light receiver; (d) positioning in each light path one first grate in coarse alignment with one set of spaced reflective surfaces; and (e) fine positioning the first substrate, the second substrate, or both while light on each light path is received by the light receiver of said light path after reflection and passage of said light through the beam splitter, reflection by at least one of the spaced reflective surfaces in said light path, and passage twice through at least one gap in the first grate in said light path.

Each set of spaced reflective surfaces can be comprised of a second grate that includes a plurality of spaced bars and a gap between each pair of spaced bars. Each bar of the second grate can define one of the reflective surfaces. Each gap of said second grate can define a structure of the second substrate that is less reflective than each reflective surface.

Each light receiver can output a signal having a level related to an amount of light received by said light receiver. Step (e) can include fine positioning the first substrate, the second substrate, or both until a combination of the levels of the signals output by the light receivers equals a predetermined value or falls within a predetermined range of values. The predetermined value can be zero.

The first substrate and the second substrate can each have a rectangular or square shape. The first substrate can have one first grate adjacent each corner. The second substrate can have one set of spaced reflective surfaces adjacent each corner.

Also disclosed herein is a shadow mask-substrate alignment method comprising: (a) providing a substrate having a plurality of first grates in a pattern; (b) providing a shadow mask having a plurality of second grates in the same pattern as the plurality of first grates, wherein each grate includes a plurality of spaced bars and a gap between each pair of spaced bars; (c) defining a plurality of light paths, wherein each light path includes a light source, a light receiver and a beam splitter; (d) positioning in each light path one first grate in coarse alignment with one second grate; and (e) fine positioning the substrate, the shadow mask, or both until a predetermined amount of light on each light path is received by the light receiver of said light path after said light on said light path, output by the light source of said light path, is reflected by the beam splitter of said light path, passes a first time through at least one gap in one of the first grate or second grate in said light path, is reflected by at least one bar of the other of the first grate or second grate in said light path, passes a second time back through the at least one gap in the one first grate or second grate in said light path, and then passes through the beam splitter of said light path for receipt by the light receiver of said light path.

Each bar and each gap can have the same width.

Step (e) can include fine positioning the substrate, the shadow mask, or both until the bars of the first and second grates partially overlap the gaps of the second and first grates, respectively.

The bars of the first and second grates can partially overlap the gaps of the second and first grates, respectively, by 50%.

Each light receiver can output a signal having a level related to amount of light received by said light receiver. Step (e) can include fine positioning the substrate, the shadow mask, or both until a combination of the levels of the signals output by the plurality of light receivers equals a predetermined value or falls within a predetermined range of values. The predetermined value can be zero.

The substrate and the shadow mask can each have a rectangular or square shape with one grate adjacent each corner of the rectangle or square. A longitudinal axis of each bar can extend radially ±15 degrees from a central axis of the corresponding substrate or shadow mask.

DETAILED DESCRIPTION OF THE INVENTION

Figure 1A:
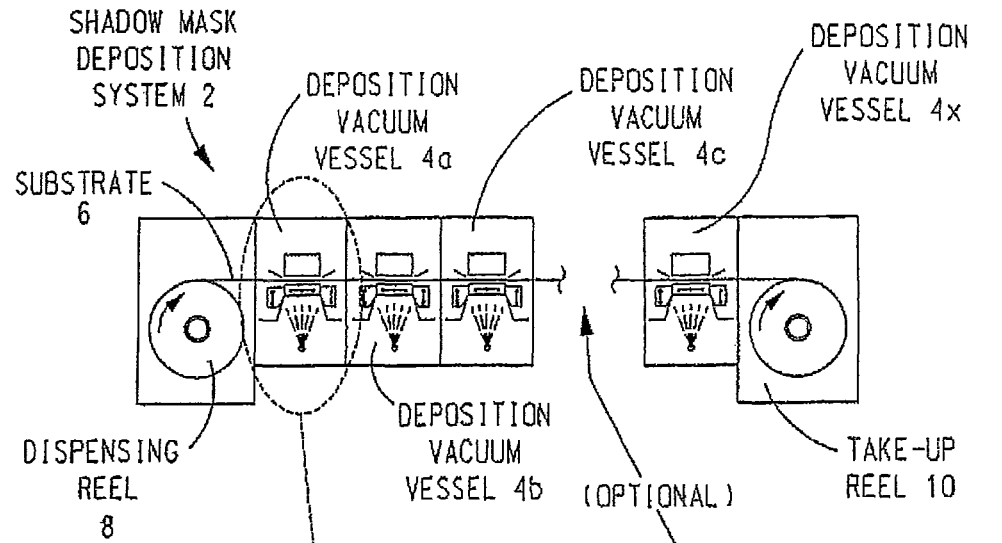
FIG. 1A is a diagrammatic illustration of a shadow mask deposition system for forming pixel structures of a high resolution OLED active matrix backplane.
Figure 1B:
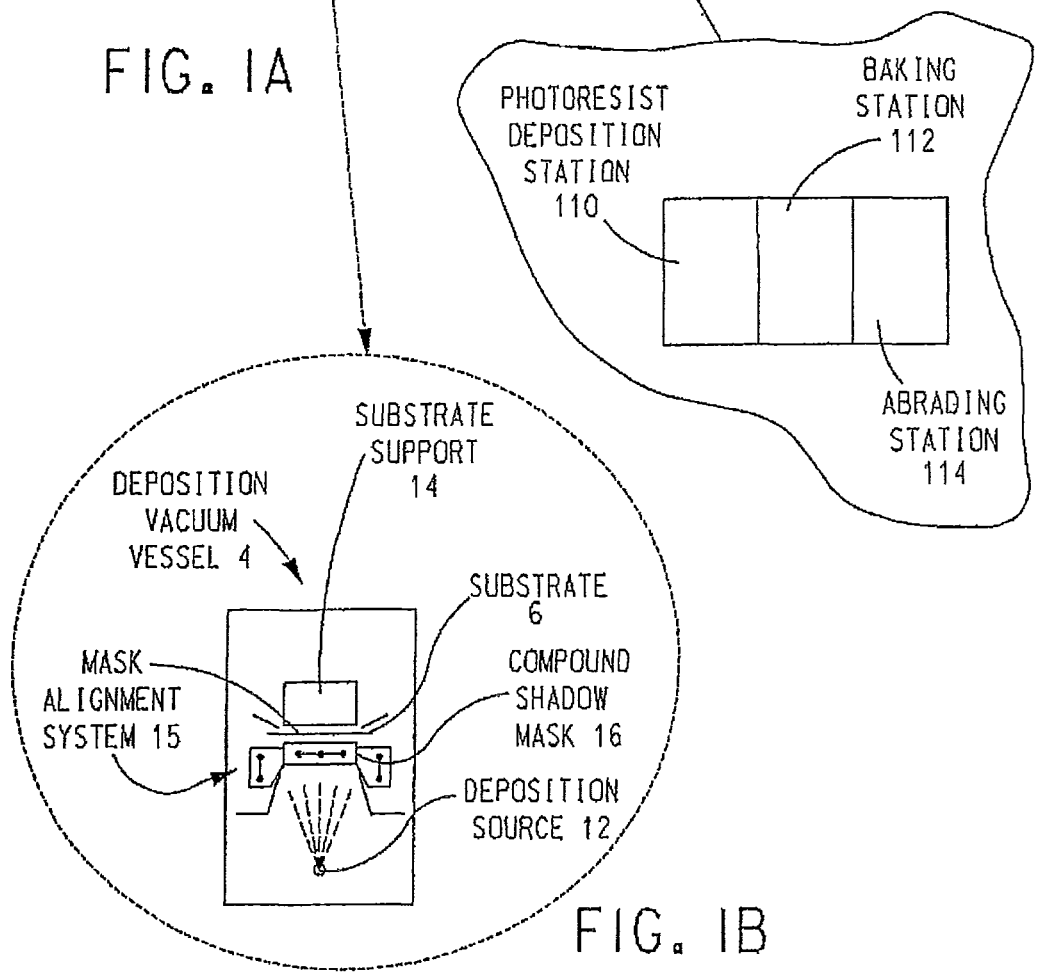
FIG. 1B is an enlarged view of a single deposition vacuum vessel of the shadow mask deposition system of FIG. 1A.

With reference to FIGS. 1A and 1B, a shadow mask deposition system 2 for forming an electronic device, such as, without limitation, a high resolution active matrix organic light emitting diode (OLED) display, includes a plurality of serially arranged deposition vacuum vessels 4 (e.g., deposition vacuum vessels 4a-4x). The number and arrangement of deposition vacuum vessels 4 is dependent on the number of deposition events required for any given product to be formed therewith.

In one exemplary non-limiting use of shadow mask deposition system 2, a continuous flexible substrate 6 translates through the serially arranged deposition vacuum vessels 4 by means of a reel-to-reel mechanism that includes a dispensing reel 8 and a take-up reel 10. Alternatively, substrate 6 can be a standalone (versus continuous) substrate that is translated through serially arranged deposition vacuum vessels 4 by any suitable means known in the art. Hereinafter, for the purpose of describing the present invention, it will be assumed that substrate 6 is a standalone substrate.

Each deposition vacuum vessel includes a deposition source 12, a substrate support 14, a shadow mask alignment system 15, and a shadow mask 16. For example, deposition vacuum vessel 4a includes deposition source 12a, substrate support 14a, mask alignment system 15a, and shadow mask 16a; deposition vacuum vessel 4b includes deposition source 12b, substrate support 14b, mask alignment system 15b, and shadow mask 16b; and so forth for any number of deposition vacuum vessels 4.

Each deposition source 12 is charged with a desired material to be deposited onto substrate 6 through one or more openings in the corresponding shadow mask 16 which is held in intimate contact with the portion of substrate 6 in the corresponding deposition vacuum vessel 4 during a deposition event. Shadow mask 16 can be a conventional single layer shadow mask or a compound (multi-layer) shadow mask of the type disclosed in U.S. Pat. No. 7,638,417 to Brody, which is incorporated herein by reference.

Each shadow mask 16 of shadow mask deposition system 2 includes one or more openings The opening(s) in each shadow mask 16 correspond(s) to a desired pattern of material to be deposited on substrate 6 from a corresponding deposition source 12 in a corresponding deposition vacuum vessel 4 as substrate 6 is translated through shadow mask deposition system 2.

Each shadow mask 16 can be formed of, for example, nickel, chromium, steel, copper, Kovar® or Invar®, and has a thickness desirably between 20 and 200 microns, and more desirably between 20 and 50 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that shadow mask deposition system 2 may include additional stages (not shown), such as an anneal stage, a test stage, one or more cleaning stages, a cut and mount stage, and the like, as are well-known. In addition, the number, purpose, and arrangement of deposition vacuum vessels 4 can be modified by one of ordinary skill in the art as needed for depositing one or more materials in a desired order required for a particular application. An exemplary shadow mask deposition system and method of use thereof is disclosed in U.S. Pat. No. 6,943,066 to Brody et al., which is incorporated herein by reference.

Deposition vacuum vessels 4 can be utilized for depositing materials on substrate 6 to form one or more electronic elements of an electronic device on substrate 6. Each electronic element may be, for example, a thin film transistor (TFT), a memory element, a capacitor, etc. A combination of one or more electronic elements can be deposited to form a higher level electronic element, such as, without limitation, a subpixel or a pixel of the electronic device. As disclosed in U.S. Pat. No. 6,943,066 incorporated herein by reference, a multi-layer circuit can be formed solely by successive depositions of materials on substrate 6 via successive deposition events in deposition vacuum vessels 4.

Each deposition vacuum vessel 4 is connected to a source of vacuum (not shown) which is operative for establishing a suitable vacuum therein in order to enable a charge of the material disposed in the corresponding deposition source 12 to be deposited on substrate 6 in a manner known in the art, e.g., sputtering or vapor phase deposition, through the one or more openings in the corresponding shadow mask 16.

Regardless of the form of substrate 6, e.g., a continuous sheet or a standalone substrate, each deposition vacuum vessel 4 can include supports or guides that avoid the sagging of substrate 6 as it translates therethrough.

In operation of shadow mask deposition system 2, the material disposed in each deposition source 12 is deposited on substrate 6 in the corresponding deposition vacuum vessel 4 through one or more openings in the corresponding shadow mask 16 in the presence of a suitable vacuum as said substrate 6 is advanced through the deposition vacuum vessel 4, whereupon plural, progressive patterns is formed on substrate 6. More specifically, substrate 6 is positioned for a predetermined time interval in each deposition vacuum vessel 4. During this predetermined time interval, material is deposited from the corresponding deposition source 12 onto substrate 6. After this predetermined time interval, substrate 6 is advanced to the next vacuum vessel in series for additional processing, as applicable. This advancement continues until substrate 6 has passed through all deposition vacuum vessels 4 whereupon substrate 6 exits the final deposition vacuum vessel 4 in the series.

Figure 2:
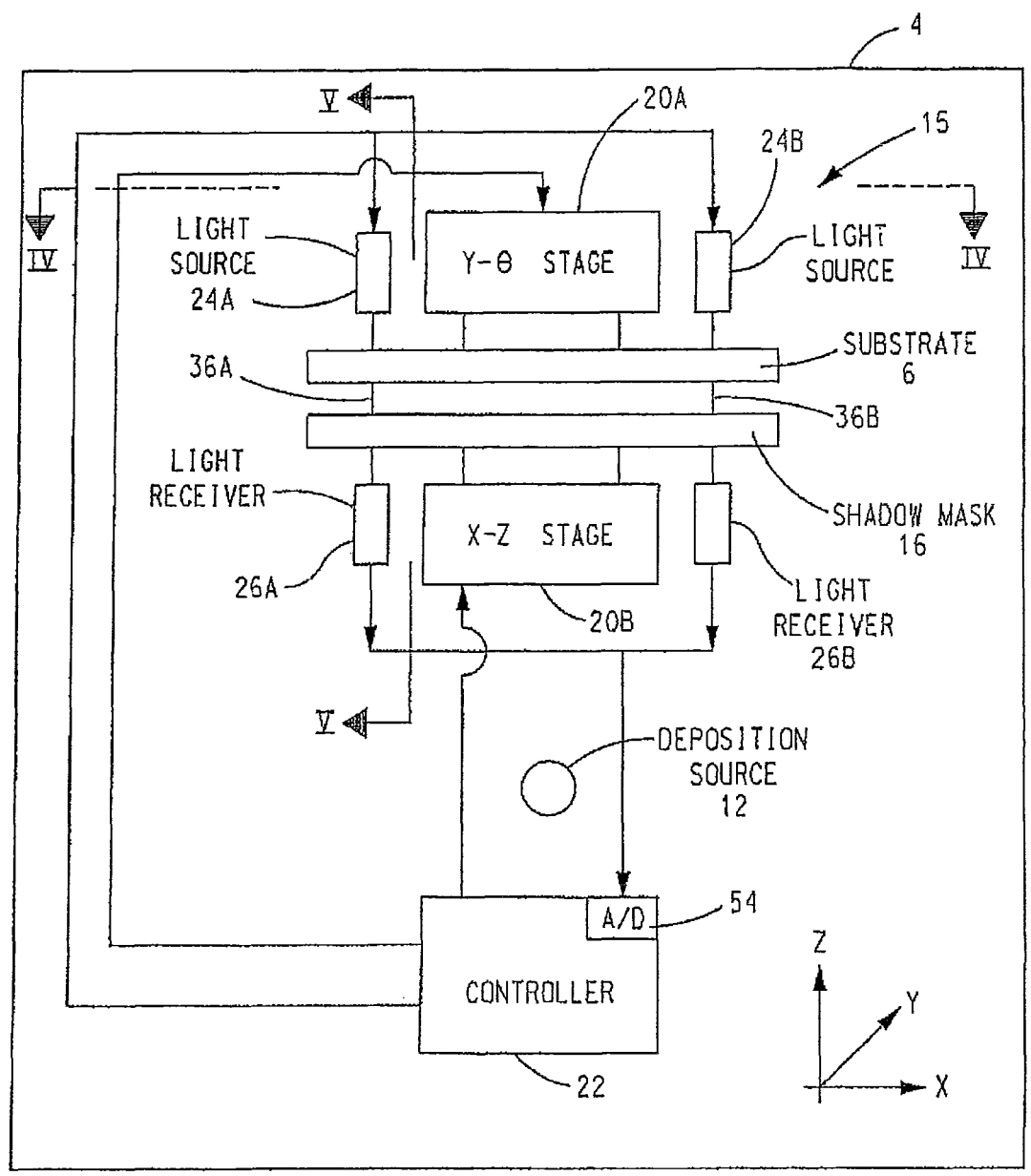
FIG. 2 is a diagrammatic view of a first embodiment shadow mask alignment system.

With reference to FIG. 2 and with continuing reference to FIGS. 1A and 1B, mask alignment system 15 includes one or more motion stages 20 for controlling the orientation and position of substrate 6, shadow mask 16, or both, to align substrate 6 and shadow mask 16 in a manner described hereinafter. One desirable, non-limiting, embodiment of mask alignment system 15 includes substrate 6 coupled to a Y-θ stage 20A and shadow mask 16 coupled to an X-Z stage 20B. The use of one or more stages 20 to effect translation, orientation, and positioning of substrate 6, shadow mask 16, or both in the X direction, the Y direction, the Z direction, and/or the θ direction (in the present example the θ direction is rotational translation of substrate 6 in the X-Y plane) is well known in the art and will not be described further herein for the purpose of simplicity.

Y-θ stage 20A and X-Z stage 20B are operated under the control of a controller 22 which can be implemented by any suitable and/or desirable combination of hardware and/or software to effect control of motion stages 20A and 20B in the manner described hereinafter.

Mask alignment system 15 further includes one or more light sources 24 and one or more light receivers 26. Each light source 24 is positioned in alignment with one light receiver 26 to define a light source 24-light receiver 26 pair. Each light source 24-light receiver 26 pair defines a light path 36 therebetween.

In use of mask alignment system, substrate 6 and shadow mask 16 are positioned in the light path 36 of each light source 24-light receiver 26 pair. In one desirable embodiment, mask alignment system 15 includes four light sources 24 and four light receivers 26, for a total of four light source 24-light receiver 26 pairs that define four light paths 36. However, this is not to be construed as limiting the invention.

Figures 3A, 3B:
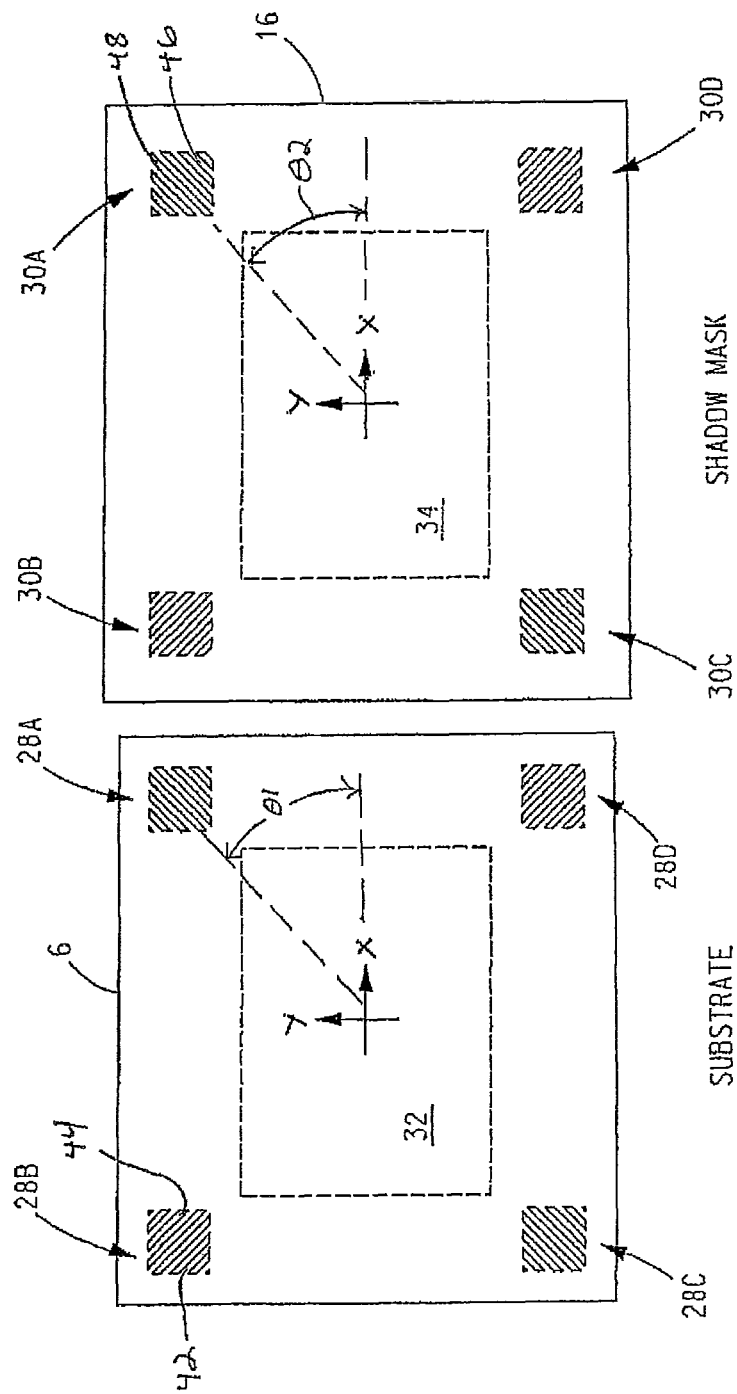
FIG. 3A and FIG. 3B are plan views of an exemplary substrate and shadow mask, respectively, each of which includes a number of alignment grates to facilitate orientation and positioning of the shadow mask to the substrate, or vice versa.

With reference to FIGS. 3A-3B and with continuing reference to FIGS. 1A-1B and 2, substrate 6 includes one or more grates 28 and shadow mask 16 includes one or more grates 30. In one non-limiting embodiment, substrate 6 includes four grates 28A-28D and shadow mask 16 includes four grates 30A-30D. In the embodiment shown in FIG. 3A, substrate 6 has a rectangular or square shape and each grate 28A-28D is positioned adjacent one of the four corners of substrate 6. Similarly, shadow mask 16 has a rectangular or square shape and each grate 30A-30D is positioned adjacent one of the four corners of shadow mask 16. The central portion of substrate 6 denoted by reference number 32 is where deposition events are to occur on substrate 6. The central portion of shadow mask 16 denoted by the reference number 34 is where shadow mask 16 includes a pattern of one or more openings where material from a deposition source 12 passes for deposit on area 32 in the same pattern as the one or more openings of area 34 of shadow mask 16.

In the embodiment of substrate 6 shown in FIG. 3A, grate 28B is a mirror image of grate 28A about the Y-axis shown in FIG. 3A; and grates 28C and 28D are mirror images of grates 28B and 28A, respectively, about the X-axis shown in FIG. 3A. However, this is not to be construed as limiting the invention.

Similarly, in the embodiment of shadow mask 16 shown in FIG. 3B, grate 30B is a mirror image of grate 30A about the Y-axis shown in FIG. 3B; and grates 30C and 30D are mirror images of grates 30B and 30A, respectively, about the X-axis shown in FIG. 3B. However, this is not to be construed as limiting the invention.

The use of mask alignment system 15 to align substrate 6 having one or more grates 28 and shadow mask 16 having one or more grates 30 will now be described.

Initially, substrate 6 is moved into spaced, coarse (or general) alignment with shadow mask 16 in the light paths 36 between light source(s) 24 and light receiver(s) 26 as shown in FIG. 2. When substrate 6 and shadow mask 16 are in coarse alignment in light paths 36 as shown in FIG. 2, each grate 28 of substrate 6 and each grate 30 of shadow mask 16 are positioned in one light path 36 of one light source 24—light receiver 26 pair. For example, where mask alignment system 15 includes four light source—light receiver pairs 24A-26A, 24B-26B, 24C-26C, and 24D-26D defining four light paths 36A-36D, respectively, and substrate 6 includes grates 28A-28D, and shadow mask 16 includes grates 30A-30D: grates 28A and 30A are positioned in light path 36A that runs from light source 24A to light receiver 26A; grates 28B and 30B are positioned in light path 36B that runs from light source 24B to light receiver 26B; grates 28C and 30C are positioned in light path 36C that runs from light source 24C to light receiver 26C; and grates 28D and 30D are positioned in light path 36D which runs from light source 24D to light receiver 26D.

Figure 4:
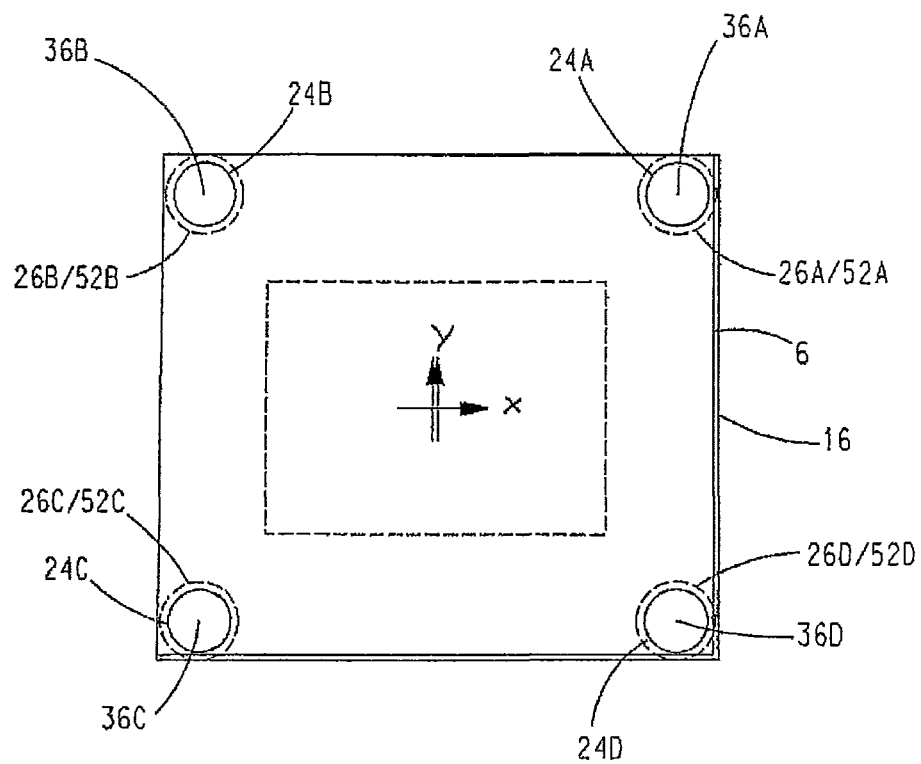
FIG. 4 is a view taken along lines IV-IV in FIG. 2.

FIG. 4 is a top down view of substrate 6 in coarse alignment with shadow mask 16 between light sources 24A-24D and light receivers 26A-26D (shown in phantom) and the position of light paths 36A-36D for each light source—light receiver pair, respectively. In FIG. 4 it is to be understood that grates 28A and 30A are positioned in light path 36A; grates 28B and 30B are positioned in light path 36B; grates 28C and 30C are positioned in light path 36C; and grates 28D and 30D are positioned in light path 36D.

Figure 5:
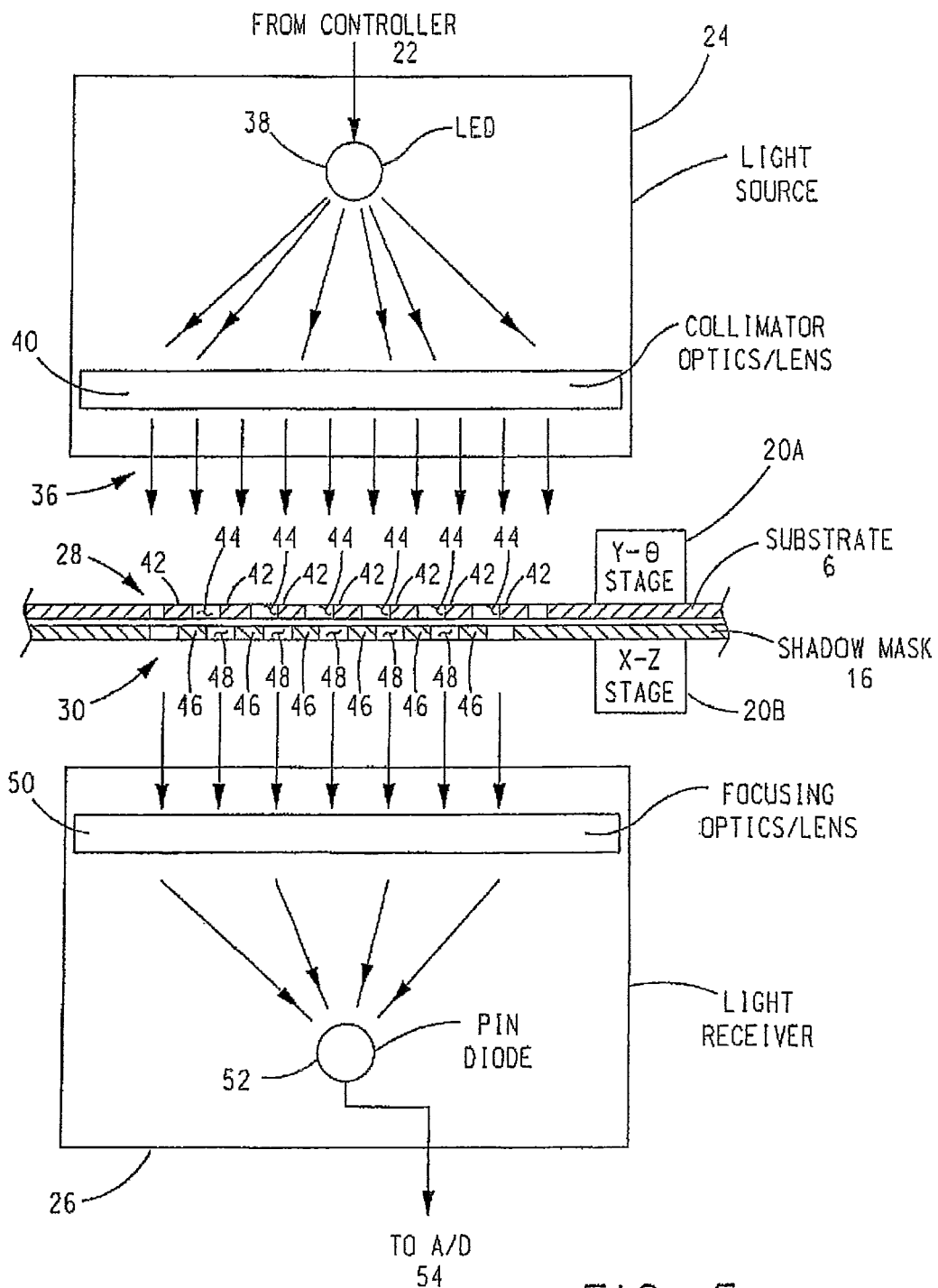
FIG. 5 is a view taken along lines V-V in FIG. 2.

With reference to FIG. 5, the fine alignment of one grate 28 of substrate 6 and one grate 30 of shadow mask 16 (i.e., one grate pair 28-30) lying along one light path 36 will now be described. It is to be understood, however, that the fine alignment of the grate pair 28-30 lying along the light path 36 shown in FIG. 5 is also applicable to the alignment of each grate pair 28-30 positioned in each light path 36.

At a suitable time, each light source 24 is activated to output light along its light path 36. In one, non-limiting, embodiment each light source includes an LED 38 which outputs light to a collimator optic/lens 40 which collimates the light output by LED 38 and outputs said collimated light along light path 36.

Each grate 28 of substrate 6 includes a plurality of spaced bars 42, desirably spaced parallel bars. Each pair of spaced bars 42 is separated by a gap 44. Desirably, the width of each gap 44 is the same. Similarly, each grate 30 includes a plurality of spaced bars 46, desirably spaced parallel bars. Each pair of spaced bars 46 is separated by a gap 48. Desirably, the width of each gap 48 is the same. Desirably, the width of each gap 44 and each gap 48 are also the same. However, the widths of the gaps being the same in grate 28, grate 30, or both grates 28 and 30 is not to be construed as limiting the invention.

With continuing reference to FIG. 5 and with reference back to FIGS. 3A and 3B, it is not necessary that each bar or each gap of substrate 6 and shadow mask 16 be oriented or positioned at the same angle relative to its respective X axis. For example, a longitudinal axis of each bar 42 and each gap 44 of substrate 6 is desirably, nominally oriented or positioned at an angle θ1 of 45 degrees with respect to the X axis shown in FIG. 3A. However, the orientation angle θ1 of the longitudinal axis of each bar 42 and each gap 44 can vary ±15 degrees with respect to the nominal orientation angle θ1 of 45 degrees with respect to the X axis. Moreover, each bar 42 and each gap 44 can be oriented or positioned at a different angle θ1. Desirably, however, the bars 42 and gaps 44 of each grate of substrate 6 are parallel.

Similarly, a longitudinal axis of each bar 46 and each gap 48 of shadow mask 16 is desirably, nominally oriented or positioned at an angle θ2 of 45 degrees with respect to the X axis shown in FIG. 3B. However, the orientation angle θ2 of the longitudinal axis of each bar 46 and each gap 48 can vary ±15 degrees with respect to the nominal orientation angle θ2 of 45 degrees with respect to the X axis. Moreover, each bar 46 and each gap 48 can be oriented or positioned at a different angle θ2. Desirably, however, the bars 46 and gaps 48 of each grate of shadow mask 16 are parallel.

More generally, the longitudinal axis of each bar 42, 46, and the longitudinal axis of each gap 44 and 48 desirably extends radially ±15 degrees from a center of substrate 6 and shadow mask 16, respectively. Desirably, for each grate, the bars and gaps of said grate are parallel. However, it is also envisioned that the bars and gaps of said grate can extend radially in a spoke-like pattern from the center of substrate 6 or shadow mask 16, as may be the case. Thus, where angles θ1-θ2 are, for example, without limitation, oriented or positioned at an angle of 30 degrees with respect to the corresponding X axis, the longitudinal axis of each bar 42, 46, and the longitudinal axis of each gap 44 and 48 can vary from 30 degrees by ±15 degrees.

It should be appreciated that it is possible for the angular displacement between bars 42 and 46 and gaps 48 and 44 of any grate pair 28-30 to vary by as much as 30 degrees, e.g., when a bar 42 is positioned at an angle of 60 degrees with respect to the X axis of its substrate 6, a gap 48 is positioned at an angle of 30 degrees with respect to the X axis of its shadow mask 16, and the X axes of the substrate 6 and the shadow mask 16 are parallel; the difference between 60 degrees and 30 degrees being 30 degrees.

Collimated light output by light source 24 passes through the gaps 44 and 48 of coarsely aligned grates 28 and 30, respectively, and is received by light receiver 26. Light receiver 26 includes a focusing optics/lens 50 which focuses the collimated light after passage through the coarsely aligned gaps 44 and 48 of grates 28 and 30 for receipt by a light detection means in the form of a PIN diode 52. The output of each PIN diode 52 of each light receiver 26 of mask alignment system 15 is provided to an analog-to-digital (A/D) convertor 54 of controller 22 which converts the analog output of each PIN diode 52 into a corresponding digital signal for processing by a processing means of controller 22. The output of each PIN diode 52 corresponds to the amount of light received by the PIN diode 52—the greater the amount of light received by the PIN diode 52 the greater its output voltage, the lesser the amount of light received by the PIN diode 52 the lesser its output voltage.

At a suitable time, controller 22 commences fine positioning of substrate 6, shadow mask 16, or both via Y-θ stage 20A and/or X-Z stage 20B to align substrate 6 and shadow mask 16 relative to each other such that, for each grate pair 28-30 positioned in a light path 36, at least some of the bars 42 of grate 28 overlap (in a direction transverse, desirably perpendicular to light path 36) some of the gaps 48 of grate 30 to a desired extent, and at least some of the bars 46 of grate 30 overlap (in a direction transverse, desirably perpendicular to light path 36) some of the gaps 44 of grate 28 to a desired extent. Desirably, each gap 48 of shadow mask 16 is partially overlapped by a bar 42 of substrate 6 and each gap 44 of substrate 6 is partially overlapped by a bar 46 of shadow mask 16 as shown in FIG. 5. More desirably, bars 42 and 46 partially overlap the width of gaps 48 and 44, respectively, by 50%. In other words, 50% of the width of gaps 48 and 44 is overlapped by bars 42 and 46.

For each grate pair 28-30 positioned in one of the light paths 36, controller 22 detects when bars 42 and 46 overlap gaps 48 and 44, respectively, to a desired extent, by comparing the digitized output of the PIN diode 52 on said light path 36 (which digitized output is obtained via A/D 54 and which digitized output corresponds to the collimated light passing through gaps 48 and 44) to a predetermined value or a predetermined range of values. Upon detecting that the digitized output of the PIN diode 52 is not at the predetermined value or within the predetermined range of values, controller 22 causes one or more motion stages 20A and 20B to adjust the X, Y, and/or θ position of substrate 6, shadow mask 16, or both, as necessary until a desired amount of overlap between the bars 42 and 46 overlap gaps 48 and 44, respectively, of the grate pair 28-30 is detected by controller 22 via the digitized output of PIN diode 52. Since the amount of overlap between bars 42 and 46 and gaps 48 and 44, respectively, of the grate pair 28-30 affects the amount of collimated light that reaches PIN diode 52, by comparing the digitized output of PIN diode 52 to the predetermined value or the predetermined range of values, controller 22 can determine when an appropriate amount of overlap of the bars and gaps of the grate pair 28-30 in light path 36 has been achieved. In a similar manner, controller 22 can determine when an appropriate amount of overlap of the bars and gaps of each other grate pair 28-30 in each other light path 36 has been achieved.

In one non-limiting embodiment, controller 22 desirably combines the output of all of the PIN diodes 52 of light receivers 26A-26D to determine when proper X, Y, and θ alignment between substrate 6 and shadow mask 16 has been achieved. More specifically, suppose controller 22 adjusts the orientation/position of substrate 6, shadow mask 16, or both. After some period of time, controller 22 stops adjusting the orientation/position of substrate 6, shadow mask 16, or both, and causes A/D 54 to sample and digitize the outputs of PIN diodes 52A-52D (shown in FIG. 4) of light receivers 26A-26D. Controller 22 associates in a memory of controller 22 the digitized outputs of PIN diodes 52A-52D with variables f1-f4 and combines these variables for the X, Y, and rotational or angular (θ) displacements of substrate 6, shadow mask 16, or both as follows:

$$X \text{ displacement} = f1 - f2 - f3 + f4 \quad \text{(Equation 1)}$$

$$Y \text{ displacement} = f1 + f2 - f3 - f4 \quad \text{(Equation 2); and}$$

$$\theta \text{ displacement} = f1 - f2 + f3 - f4 \quad \text{(Equation 3).}$$

Upon controller 22 determining that the X, Y, and θ displacements determined by Equations 1-3 above each equals 0, controller 22 recognizes this condition as corresponding to substrate 6 and shadow mask 16 having a desired alignment. On the other hand, if any one of the X displacement, Y displacement, or θ displacement is not equal to 0, controller 22 recognizes this condition as corresponding to substrate 6 and shadow mask 16 NOT having a desired alignment, whereupon controller 22 causes the one or more motion stages 20A-20B to adjust the X, Y, and/or θ position(s) of substrate 6, shadow mask 16, or both, as necessary to cause the X displacement, Y displacement, or θ displacement determined by Equations 1-3 above to each equal 0.

Desirably, controller 22 repeats the foregoing steps of: adjusting the orientation/position of substrate 6, shadow mask 16, or both; stopping the adjusting of the orientation/position of substrate 6, shadow mask 16, or both; sampling and digitizing the outputs of PIN diodes 52A-52D; and determining whether the X, Y, and θ displacements determined by Equations 1-3 above each equals 0 until the X, Y, and θ displacements determined by Equations 1-3 above in fact each equals 0, a predetermined number of repetitions of said steps has occurred, or a predetermined amount of time has elapsed.

Upon determining that the X, Y, and θ displacements each equals 0, controller 22 causes the motion stage 20 that moves in the Z direction to move substrate 6 and shadow mask 16 into intimate contact from the position in spaced relationship shown in FIG. 5, which spaced relation is used for the purpose of aligning substrate 6 and shadow mask 16.

The determination of the X, Y, and θ displacements using Equations 1-3 in the above-described manner to each equal 0, however, is not to be construed as limiting the invention since it is envisioned that each displacement can be within a range of suitable values unique to said displacement or common to all of said displacements. For example, without limitation, controller 22 can be programmed such that an X displacement that falls within a range of ±1 is acceptable, that a range ±1.5 for the Y displacement value is acceptable, and that a range of ±0.5 for the θ displacement is acceptable. Alternatively, controller 22 can be programmed to use the same range of values for each displacement. For example, controller 22 may be programmed such that it is acceptable to have each of the X, Y, and θ displacements fall within a range of ±1.

As can be seen, by utilizing the output of the PIN diodes 52A-52D of light receivers 26A-26D, controller 22 can position substrate 6 and shadow mask 16 in a desired state of alignment with a high degree of accuracy. To this end, controller 22 can incrementally orient/position substrate 6, shadow mask 16, or both, until the grates 28 of substrate 6 and the grates 30 of shadow mask 16 are aligned to a desired extent. In the event controller 22 determines that further alignment of substrate 6 and shadow mask 16 is needed, controller 22 can make an informed decision from the values of the X, Y, and θ displacements determined using Equations 1-3 above which way to move or rotate substrate 6, shadow mask 16, or both, in the X, Y, and θ directions as necessary to improve the alignment of substrate 6 and shadow mask 16. Thus, controller 22 can orient/position substrate 6, shadow mask 16, or both, in a first position and then acquire the output of the PIN diodes 52A-52D of light receivers 26A-26D to determine if substrate 6 and shadow mask 16 are properly aligned. If so, controller 22 causes substrate 6 and shadow mask 16 to move in the Z direction into intimate contact in preparation for a deposition event occurring in deposition vacuum vessel 4. However, if substrate 6 and shadow mask 16 are determined to not be in proper alignment, controller 22 can incrementally orient/position substrate 6, shadow mask 16, or both, to another position, where controller 22 samples the outputs of the PIN diodes 52A-52D of light receivers 26A-26D. The process of sampling the outputs of PIN diodes 52A-52D of light receivers 26A-26D and incrementally orienting/positioning substrate 6, shadow mask 16, or both, continues until controller 22 determines that substrate 6 and shadow mask 16 are aligned to a desired extent determined by the programming of controller 22.

As can be further seen, controller 22 causes the orientation of the substrate 6, the shadow mask 16, or both, to be adjusted to position the grates 28 of substrate 6 and the grates 30 of shadow mask 16, or both, until a predetermined amount of collimated light on each light path 36 passes through the grates that lie on said light path 36 for receipt by the corresponding light receiver 26. Stated differently, controller 22 fine positions substrate 6, shadow mask 16, or both, until a predetermined amount of light on each light path 36 passes through the grates in said path and is received by the light receiver on said light path.

Figure 6:
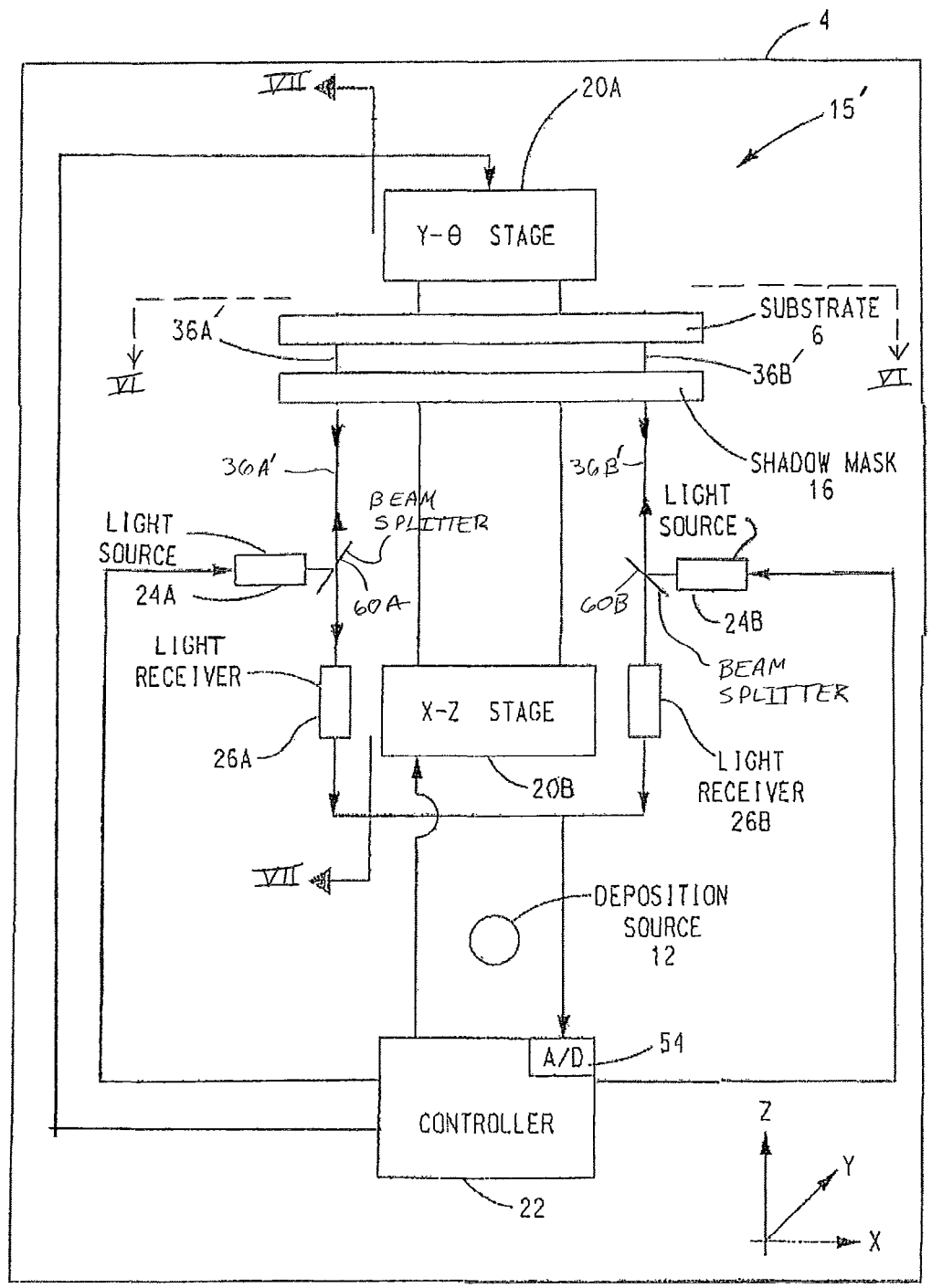
FIG. 6 is a diagrammatic view of a second embodiment shadow mask alignment system.

With reference to FIG. 6, another embodiment shadow mask alignment system 15' is similar in all respects to mask alignment system 15 shown in FIG. 2 with the following exceptions: each light source 24-light receiver 26 pair is positioned to the same side of substrate 6 and shadow mask 16; and each light source 24-light receiver 26 pair together with a beam splitter 60 defines a light path 36'. More specifically, each grate 28 of substrate 6 and each grate 30 of shadow mask 16 are positioned in one light path 36' of one light source 24-light receiver 26 pair shown in FIG. 6. Each light path 36' runs from one light source 24 for reflection by one of the beam splitters 60 which reflects the light from the light source 24 toward a grate 28 via a grate 30 of shadow mask 30 of substrate 6 in alignment with said grate 28 of substrate 6. Some of the light impinging on grate 28 of substrate 6 is reflected by said gate 28 back through grate 30 of shadow mask 16 in alignment with said grate 28 toward beam splitter 60. Beam splitter 60 passes some of the light reflected from grate 28 of substrate 6 after passage through grate 30 of shadow mask 16 in alignment with said grate 28 to the light receiver 26 at the terminal end of said light path 36'.

The foregoing description assumed that light source 24-light receiver pair 26, and beam splitter 60 are positioned on a side of shadow mask 16 opposite substrate 6. However, it is envisioned that light source 24-light receiver pair 26 and beam splitter 60 can be positioned on the other side of substrate 6, whereupon the light from light source 24 reflected by beam splitter 60 first passes through a grate 28 of substrate 6 before partial reflection by a grate 30 of shadow mask 16 and passage of said partially reflected light back through said grate 28 toward beam splitter 60 which passes some of the reflected light passing through grate 30 to light receiver 26. Accordingly, the foregoing description and illustration in FIG. 6 of light source 24-light receiver 26 pair and beam splitter 60 being positioned on a side of shadow mask 16 opposite substrate 6 is not to be construed as limiting the invention.

The use of mask alignment system 15' to align substrate 6 having one or more grates 28 and shadow mask 16 having one or more grates 30 will now be described.

Initially, substrate 6 is moved into spaced, coarse (or general) alignment with shadow mask 16. When substrate 6 and shadow mask 16 are in coarse alignment, each grate 28 of substrate 6 and each grate 30 of shadow mask 16 are positioned in the light path 36' of one light source 24-light receiver 26 pair. For example, where mask alignment system 15' includes four light source-light receiver pairs 24A-26A, 24B-26B, 24C-26C, and 24D-26D (shown schematically in FIG. 7) defining four light paths 36A', 36B', 36C', and 36D' (also shown in FIG. 7), respectively, and substrate 6 includes grates 28A, 28B, 28C, and 28D, and shadow mask 16 includes grates 30A, 30B, 30C, and 30D: grates 28A and 30A are positioned in light path 36A' that runs from light source 24A to light receiver 26A via beam splitter 60A; grates 28B and 30B are positioned in light path 36B' that runs from light source 24B to light receiver 26B via beam splitter 60B; grates 26C and 30C are positioned in light path 36C' that runs from light source 24C to light receiver 26C via beam splitter 60C; and grates 28D and 30D are positioned in light path 36D' which runs from light source 24D to light receiver 26D via beam splitter 60D.

Figure 7:
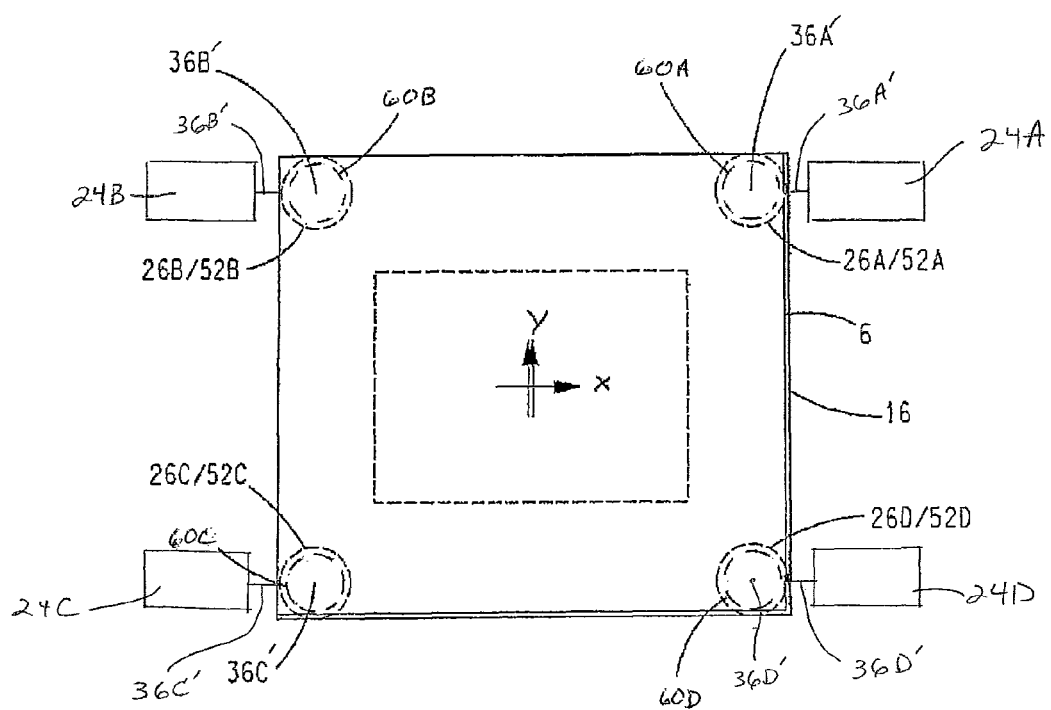
FIG. 7 is a view taken along lines VI-VI in FIG. 6.

FIG. 7 is a top down schematic view of substrate 6 in coarse alignment with shadow mask 16 showing light sources 24A-24D, light receivers 26A-26D (shown in phantom), beam splitters 60A-60D (shown in phantom), and light paths 36A'36D' for each light source-light receiver pair, respectively. In FIG. 7, it is to be understood that grates 28A and 30A are positioned in light path 36A'; grates 28B and 30B are positioned in light path 36B'; grates 26C and 30C are positioned in light path 36C'; and grates 28D and 30D are positioned in light path 36D'.

Figure 8:
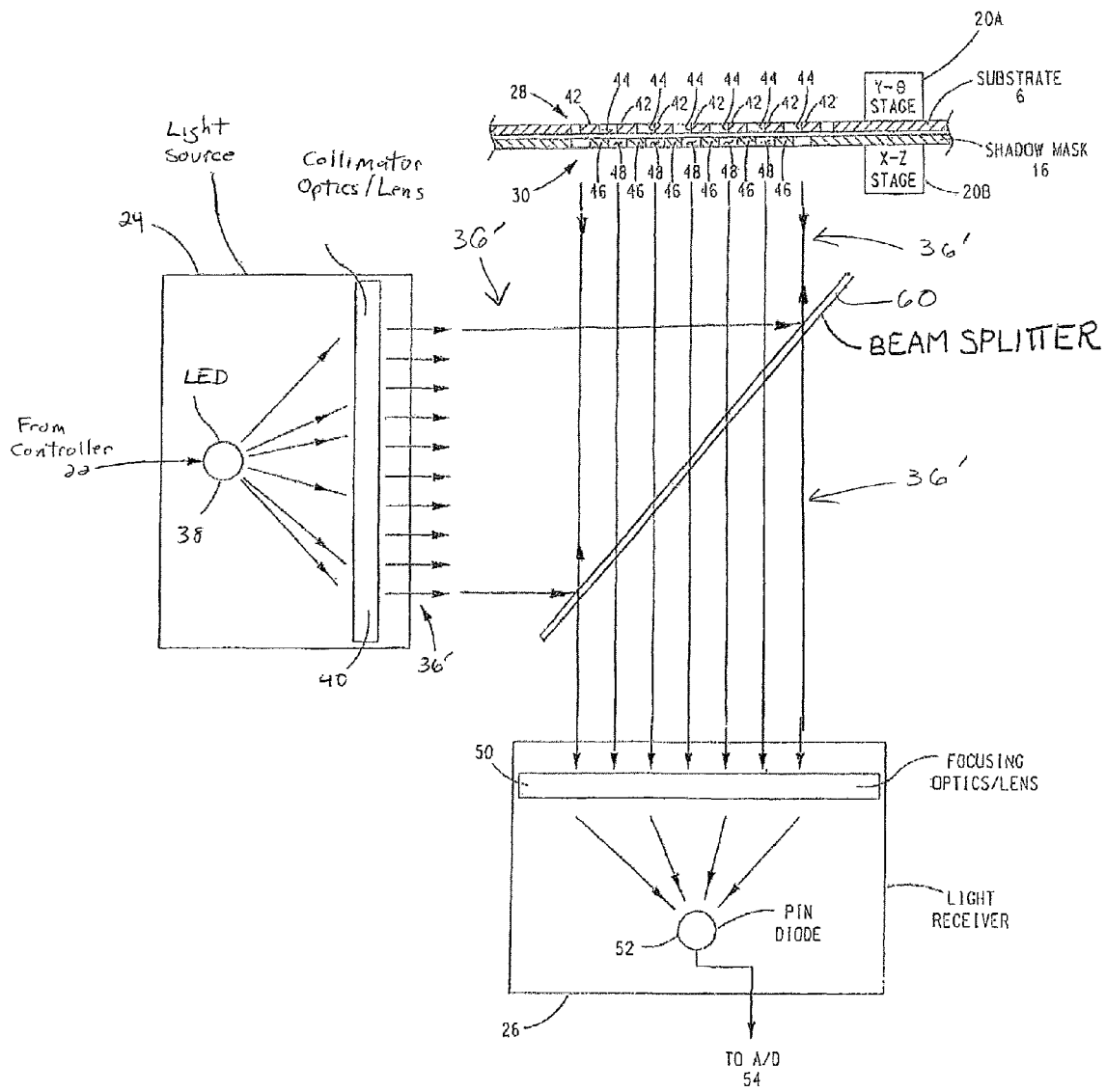
FIG. 8 is a view taken along lines VII-VII in FIG. 6.

With reference to FIG. 8, the fine alignment of one grate 28 of substrate 6 and one grate 30 of shadow mask 16 (i.e., one grate pair 28-30) lying along one light path 36' will now be described. It is to be understood, however, that fine alignment of the grate pair 28-30 lying along light path 36' shown in FIG. 8 is also applicable to the alignment of each other grate pair 28-30 positioned in each other light path 36'.

Starting with shadow mask 16 and substrate 6 in spaced relation, at a suitable time, each light source 24 is activated to output light along its light path 36'. In one, non-limiting, embodiment each light source includes LED 38 which outputs light to collimator optics/lens 40 which collimates the light output by LED 38 and outputs said collimated light to beam splitter 60 which reflects at least a portion of the collimated light output by collimator optics/lens 40 toward one grate pair 28-30.

As discussed above, each grate 30 of shadow mask 16 includes a plurality of spaced bars 46, desirably spaced parallel bars. Each pair of spaced bars 46 is separated by a gap 48. Desirably, the width of each gap 48 is the same. Similarly, each grate 28 of substrate 6 includes a plurality of spaced bars 42, desirably spaced parallel bars. Each pair of spaced bars 42 is separated by a gap 44. Desirably the width of each gap 44 is the same. Moreover, the widths of each gap 44 and each gap 48 are also desirably the same. However, the widths of the gaps 44, 48 being the same in grate 28, grate 30, or both grates 28 and 30, is not to be construed as limiting the invention.

Collimated light from beam splitter 60 that passes through gaps 48 of grate 30 and gaps 44 of grate 28 does not contribute to the light reflected by spaced bars 42 of grate 28. However, collimated light reflected by spaced bars 42 of grate 28 passes back through gaps 48 of grate 30 and propagates toward beam splitter 60. At beam splitter 60, at least part of the reflected light passes through beam splitter 60 for receipt by light receiver 26.

Focusing optics/lens 50 of light receiver 26 focuses the part of the reflected light that passes through beam splitter 60 toward the light detection means in the form of PIN diode 52. The output of each PIN diode 52 of each light receiver 26 of mask alignment system 15' is provided to analog to digital (A/D) converter 54 of controller 22 (shown in FIG. 6) which converts the analog output of each PIN diode 52 into a corresponding digital signal for processing by a processing means of controller 22. The output of each PIN diode 52 corresponds to the amount of light received by said PIN diode 52.

At a suitable time, controller 22 commences fine positioning of substrate 6, shadow mask 16, or both, via Y-θ stage 20A and/or X-Z stage 20B to align substrate 6 and shadow mask 16 relative to each other such that, for each light path 36', some of the bars 42 of grate 28 overlap (in a direction transverse, desirably perpendicular to light path 36') some of the gaps 48 of grate 30 to a desired extent, and, conversely, at least some of the bars 46 of grate 30 overlap (in a direction transverse, desirably perpendicular to light path 36') some of the gaps 44 of grate 28 to a desired extent. Desirably, each gap 48 of shadow mask 16 is partially overlapped by a bar 42 of substrate 6, and each gap 44 of substrate 6 is partially overlapped by a bar 46 of shadow mask 16 as shown in FIG. 8. More desirably, bars 42 and 46 partially overlap the widths of gaps 48 and 44, respectively, by a desired percentage, e.g., 50%. In other words, 50% of the width of gaps 48 and 44 are overlapped by bars 42 and 46, respectively.

For each grate pair 28-30 associated with one of the light paths 36', controller 22 detects when bars 42 overlap gaps 48 to a desired extent by comparing the digitized output of the PIN diode 52 on said light path 36', which digitized output is obtained via A/D 54 and which digitized output corresponds to the light reflected from bars 42 passing through gaps 48, to a predetermined value or a predetermined range of values.

Upon detecting that the digitized output of the PIN diode 52 is not at the predetermined value or within the predetermined range of values, controller 22 causes the one or more motion stages 20A and/or 20B to adjust the X, Y, and/or θ position of substrate 6, shadow mask 16 or both, as necessary until a desired amount of overlap between bars 42 and gaps 48 of the grate pair 28-30 is detected by controller 22 via the digitized output of PIN diode 52. Since the amount of overlap between bars 42 and gaps 48 of the grate pair 28-30 affects the amount of collimated light that reaches PIN diode 52, by comparing the digitized output of PIN diode 52 to the predetermined value or the predetermined range of values, controller 22 can determine when an appropriate amount of overlap of the bars 42 and gaps 48 of the grate pair 28-30 associated with the light path 36' has been achieved. In a similar manner, controller 22 can determine when an appropriate amount of overlap of the bars 42 and gaps 48 of each other grate pair 28-30 associated with each other light path 36' has been achieved.

In one non-limiting embodiment, controller 22 desirably combines the output of all of the pin diodes 52 of light receivers 26A-26D to determine when proper X, Y, and θ alignment between substrate 6 and shadow mask 16 has been achieved. More specifically, suppose controller adjusts the orientation/position of substrate 6, shadow mask 16, or both. After some period of time, controller stops adjusting the orientation/position of substrate 6, shadow mask 16, or both, and causes A/D 54 to sample and digitize the outputs of pin diodes 52A-52D (shown in FIG. 7) of light receivers 26A-26D. Controller 22 associates in a memory of controller 22 the digitized output of pin diodes 52A-52D with variables f1-f4 and combines these variables for the X, Y, and rotational or angular (θ) displacements of substrate 6, shadow mask 16, or both, as follows:

$$X \text{ displacement} = f1 - f2 - f3 + f4 \qquad \text{(Equation 1)}$$

$$Y \text{ displacement} = f1 + f2 - f3 - f4 \qquad \text{(Equation 2); and}$$

$$\theta \text{ displacement} = f1 - f2 + f3 - f4 \qquad \text{(Equation 3).}$$

Equations 1-3 immediately above are copies of equations 1-3 from the discussion of the first embodiment mask alignment system 15 discussed previously.

Upon controller 22 determining that the X, Y, and θ displacements determined by Equations 1-3 above each equals 0, controller 22 recognizes this condition as corresponding to substrate 6 and shadow mask 16 having a desired alignment. On the other hand, if any one of the X displacement, Y displacement, or θ displacement is not equal to 0, controller 22 recognizes this condition as corresponding to substrate 6 and shadow mask 16 NOT having a desired alignment, whereupon controller 22 causes the one or more motion stages 20A-20B to adjust the X, Y, and/or θ position(s) of substrate 6, shadow mask 16, or both, as necessary to cause the X displacement, Y displacement, or θ displacement determined by Equations 1-3 above to each equal 0.

Desirably, controller 22 repeats the foregoing steps of: adjusting the orientation/position of substrate 6, shadow mask 16, or both; stopping the adjusting of the orientation/position of substrate 6, shadow mask 16, or both; sampling and digitizing the outputs of PIN diodes 52A-52D; and determining whether the X, Y, and θ displacements determined by Equations 1-3 above each equals 0 until the X, Y, and θ displacements determined by Equations 1-3 above in fact each equals 0; or until a predetermined number of repetitions of said steps has occurred; or until a predetermined amount of time has elapsed.

Upon determining that the X, Y, and θ displacements each equals 0, controller 22 causes the motion stage 20B that moves in the Z direction to move substrate 6 and shadow mask 16 into intimate contact from the position in spaced relationship shown in FIG. 8, which spaced relation is used for the purpose of aligning substrate 6 and shadow mask 16.

The determination of the X, Y, and θ displacements using Equations 1-3 in the above-described manner to each equal 0 is not to be construed as limiting the invention since it is envisioned that each displacement can be within a range of suitable values unique to said displacement or common to all of said displacements. For example, without limitation, controller 22 can be programmed such that an X displacement that falls within a range of ±1 is acceptable, that a range ±1.5 for the Y displacement value is acceptable, and that a range of ±0.5 for the θ displacement is acceptable. Alternatively, controller 22 can be programmed to use the same range of values for each displacement. For example, controller 22 may be programmed such that it is acceptable to have each of the X, Y, and θ displacements each fall within a range of ±1.

As can be seen, by utilizing the output of the PIN diodes 52A-52D of light receivers 26A-26D, controller 22 can position substrate 6 and shadow mask 16 in a desired state of alignment with a high degree of accuracy. To this end, controller 22 can incrementally orient/position substrate 6, shadow mask 16, or both, until the grates 28 of substrate 6 and the grates 30 of shadow mask 16 are aligned to a desired extent. In the event controller 22 determines that further alignment of substrate 6 and shadow mask 16 is needed, controller 22 can make an informed decision from the values of the X, Y, and θ displacements determined using Equations 1-3 above which way to move or rotate substrate 6, shadow mask 16, or both, in the X, Y, and θ directions as necessary to improve the alignment of substrate 6 and shadow mask 16. Thus, controller 22 can orient/position substrate 6, shadow mask 16, or both, in a first position and then acquire the output of the PIN diodes 52A-52D of light receivers 26A-26D to determine if substrate 6 and shadow mask 16 are properly aligned. If so, controller 22 causes substrate 6 and shadow mask 16 to move in the Z direction into intimate contact in preparation for a deposition event occurring in deposition vacuum vessel 4. However, if substrate 6 and shadow mask 16 are determined to not be in proper alignment, controller 22 can incrementally orient/position substrate 6, shadow mask 16, or both, to another position, where controller 22 samples the outputs of the PIN diodes 52A-52D of light receivers 26A-26D. The process of sampling the outputs of PIN diodes 52A-52D of light receivers 26A-26D and incrementally orienting/positioning substrate 6, shadow mask 16, or both, can continue until controller 22 determines that substrate 6 and shadow mask 16 are aligned to a desired extent determined by the programming of controller 22.

As can be seen, controller 22 causes the orientation of substrate 6, shadow mask 16, or both, to be adjusted to position grates 28 of substrate 6 and grates 30 of shadow mask 16, or both, until a predetermined amount of reflected light on each light path 36' passes through the corresponding beam splitter 60 for receipt by the corresponding light receiver 26. In other words, controller fine positions substrate 6, shadow mask 16, or both, until a predetermined amount of light reflected by bars 42 of each grate 28 passes through gaps 48 of each grate 30 and beam splitter 60 for receipt by the corresponding light receiver 26.

As shown in FIG. 8, in mask alignment system 15', light sources 24A-24D are positioned on the same side of shadow mask 16 as light receivers 26A-26D, respectively. Each light source 24-light receiver 26 pair is combined optically by utilizing beam splitter 60 (shown as a 45 degree facet) as a beam combiner.

Each light receiver 26 is positioned with its optical axis normal to shadow mask 16 and substrate 6 and is positioned to a side of shadow mask 16 opposite substrate 6. However, this is not to be construed as limiting the invention.

In the arrangement shown in FIG. 8, light from beam splitter 60 passes through gaps 48 of shadow mask 16 and is at least partially reflected by bars 42 of substrate 6, with a remainder of the light from beam splitter 60 passing through gaps 44 of substrate 6. The light reflected by bars 42 of substrate 6 passes once again through gaps 48 of shadow mask 16 and then at least partially through beam splitter 60 for receipt by light receiver 26.

Light source 24 including collimator optics/lens 40 is positioned transverse, desirably perpendicular, to light receiver 26 including focusing optics/lens 50. Beam splitter 60 is placed at the intersection of the optical axes of light source 24 and light receiver 26 with the plane of beam splitter 60 oriented to bisect at right angle the axes of light source 24 and light receiver 26. In this way, the collimated light from light source 24 is reflected by 90 degrees whereupon the reflected light propagates through gaps 48 of shadow mask 16 a first time to impinge upon and be at least partially reflected by the downward facing surfaces of bars 42 of grate 28 of substrate 6. The light reflected by the bars 42 of grate 28 passes through gaps 48 of shadow mask 16 a second time and then partially through beam splitter 60 for receipt by the PIN diode 52 of light receiver 26. The amount of light received by the PIN diode 52 of light receiver 26 is thus proportional to the degree of overlap between gaps 48 of grate 30 of shadow mask 16 and bars 42 of grate 28 of substrate 6. Thus, mask alignment 15' performs alignment sensing in a reflection mode. This is in contrast to mask alignment system 15 discussed above performing alignment sensing in a transmission mode.

One skilled in the art would readily recognize that some amount of light is discarded because of the partial use of light due to the partial reflection and partial transmission of beam splitter 60. It is well understood that the inefficiency of beam splitter 60 can be accounted for by use of collimator optics/lens 40 and beam splitter 60 being a polarizing beam splitter.

In the above-described embodiment of mask alignment system 15', each light source 24-light receiver 26 pair and each corresponding beam splitter 60 is positioned to a side of shadow mask 16 opposite substrate 6. However, this is not to be construed as limiting the invention since it is envisioned that one, or more, or all of said light source 24-light receiver 26 pairs and each corresponding beam splitter 60 can be positioned to a side of substrate 6 opposite shadow mask 16, i.e., on the other side of substrate 6. In this embodiment, light from each beam splitter 60 would first pass through the gaps 44 of substrate 6 for reflection by the bars 46 of shadow mask 16, which reflected light would then pass again through gaps 44 of substrate 6 for subsequent passage through beam splitter 60 for receipt by light receiver 26.

The invention has been described with reference to exemplary embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask-substrate alignment method comprising:
   (a) positioning a collimated light source, a beam splitter, a substrate including a first grate, a shadow mask including a second grate, and a light receiver relative to each other to define a light path that includes collimated light output by the collimated light source being at least partially reflected by the beam splitter, the at least partially reflected collimated light passing through one of the first or second grate and being at least partially reflected by the other of the first or second grate back through the one of the first or second grate, and the at least partially reflected light reflected back through the one of the first or second grate passing at least partially through the beam splitter for receipt by the light receiver; and
   (b) causing the orientation of the substrate, the shadow mask or both to be adjusted to position the first grate, the second grate, or both the first and second grates until a predetermined amount is received by the light receiver, wherein:
   each grate includes a plurality of bars in spaced relation;
   each pair of spaced bars is separated by a gap; and
   at least one of the first grate and the second grate includes at least one gap that extends through the respective substrate and shadow mask.

2. The method of claim 1, wherein each bar and each gap has the same width.

3. The method of claim 1, wherein:
   each grate includes a plurality of spaced bars and a gap separating each pair of spaced bars; and
   step (b) includes causing the orientation of the substrate, the shadow mask or both to be adjusted to position elongated axes of the bars of the first grate parallel or substantially parallel to elongated axes of the bars of the second grate and to position the bars of the first and second grates to partially overlap the gaps of the second and first grates, respectively.

4. The method of claim 3, wherein the bars of the first and second grates partially overlap the gaps of the second and first grates, respectively, by 50%.

5. The method of claim 1, wherein the collimated light source comprises:
   an LED; and
   a collimating lens operative for collimating light output by the LED.

6. The method of claim 1, wherein the light receiver comprises:
   a PIN diode; and
   a focusing lens operative for focusing light received from the beam splitter onto the PIN diode.

7. The method of claim 1, wherein a longitudinal axis of each bar extends radially ±15 degrees from a central axis of the corresponding substrate or shadow mask.

8. A shadow mask-substrate alignment method comprising:
   (a) providing a first substrate having a plurality of first grates in a pattern, wherein each first grate includes a plurality of spaced bars and a gap through the first substrate between each pair of spaced bars;
   (b) providing a second substrate having plural sets of spaced reflective surfaces in the same pattern as the plurality of first grates, wherein each set of spaced reflective surfaces includes a pair of spaced reflective surfaces;
   (c) defining a plurality of light paths, wherein each light path includes a light source and a light receiver at opposite ends of the light path, and a beam splitter in the light path between the light source and the light receiver;
   (d) positioning in each light path one first grate in coarse alignment with one set of spaced reflective surfaces; and
   (e) fine positioning the first substrate, the second substrate, or both while light on each light path is received by the light receiver of said light path after reflection and passage of said light through the beam splitter, reflection by at least one of the spaced reflective surfaces in said light path, and passage twice through at least one gap in the first grate in said light path.

9. The method of claim 8, wherein:
   each set of spaced reflective surfaces is comprised of a second grate that includes a plurality of spaced bars and a gap between each pair of spaced bars;
   each bar of said second grate defines one of the reflective surfaces; and
   each gap of said second grate defines a structure of the second substrate that is less reflective than each reflective surface.

10. The method of claim 8, wherein:
    each light receiver outputs a signal having a level related to an amount of light received by said light receiver; and
    step (e) includes fine positioning the first substrate, the second substrate, or both until a combination of the levels of the signals output by the light receivers equals a predetermined value or falls within a predetermined range of values.

11. The method of claim 10, wherein the predetermined value is zero.

12. The method of claim 8, wherein:
    the first substrate and the second substrate each have a rectangular or square shape;
    the first substrate has one first grate adjacent each corner; and
    the second substrate has one set of spaced reflective surfaces adjacent each corner.

13. A shadow mask-substrate alignment method comprising:
    (a) providing a substrate having a plurality of first grates in a pattern;

(b) providing a shadow mask having a plurality of second grates in the same pattern as the plurality of first grates, wherein each grate includes a plurality of spaced bars and a gap between each pair of spaced bars, and at least one of the first grate and the second grate includes at least one gap that extends through the respective substrate and shadow mask;

(c) defining a plurality of light paths, wherein each light path includes a light source, a light receiver and a beam splitter;

(d) positioning in each light path one first grate in coarse alignment with one second grate; and (e) fine positioning the substrate, the shadow mask, or both until a predetermined amount of light on each light path is received by the light receiver of said light path after said light on said light path, output by the light source of said light path, is reflected by the beam splitter of said light path, passes through at least one gap in one of the first or second grates in said light path, is reflected by at least one bar of the other of the first or second grates in said light path and passes back through the at least one gap in the one first or second grate in said light path and then passes through the beam splitter of said light path for receipt by the light receiver of said light path.

14. The method of claim 13, wherein each bar and each gap has the same width.

15. The method of claim 13, wherein step (e) includes fine positioning the substrate, the shadow mask, or both until the bars of the first and second grates partially overlap the gaps of the second and first grates, respectively.

16. The method of claim 15, wherein the bars of the first and second grates partially overlap the gaps of the second and first grates, respectively, by 50%.

17. The method of claim 13, wherein:
each light receiver outputs a signal having a level related to amount of light received by said light receiver; and
step (e) includes fine positioning the substrate, the shadow mask, or both until a combination of the levels of the signals output by the plurality of light receivers equals a predetermined value or falls within a predetermined range of values.

18. The method of claim 17, wherein the predetermined value is zero.

19. The method of claim 13, wherein:
the substrate and the shadow mask each have a rectangular or square shape with one grate adjacent each corner of the rectangle or square; and
a longitudinal axis of each bar extends radially ±15 degrees from a central axis of the corresponding substrate or shadow mask.

* * * * *